(12) United States Patent
Barchmann et al.

(10) Patent No.: US 10,134,943 B2
(45) Date of Patent: Nov. 20, 2018

(54) SEMICONDUCTOR CHIP, METHOD FOR PRODUCING A PLURALITY OF SEMICONDUCTOR CHIPS AND METHOD FOR PRODUCING AN ELECTRONIC OR OPTOELECTRONIC DEVICE AND ELECTRONIC OR OPTOELECTRONIC DEVICE

(71) Applicant: OSRAM Opto Semiconductors GmbH, Regensburg (DE)

(72) Inventors: Bernd Barchmann, Regensburg (DE); Fabian Eigenmann, Regensburg (DE); Andreas Ploessl, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/532,071

(22) PCT Filed: Nov. 30, 2015

(86) PCT No.: PCT/EP2015/078064
§ 371 (c)(1),
(2) Date: May 31, 2017

(87) PCT Pub. No.: WO2016/087374
PCT Pub. Date: Jun. 9, 2016

(65) Prior Publication Data
US 2017/0365736 A1    Dec. 21, 2017

(30) Foreign Application Priority Data
Dec. 1, 2014  (DE) .................. 10 2014 117 591

(51) Int. Cl.
*H01L 21/683* (2006.01)
*H01L 21/78* (2006.01)
(Continued)

(52) U.S. Cl.
CPC ...... *H01L 33/0054* (2013.01); *H01L 21/6836* (2013.01); *H01L 21/78* (2013.01);
(Continued)

(58) Field of Classification Search
CPC . H01L 21/6836; H01L 21/78; H01L 33/0054; H01L 33/091; H01L 31/022441; H01L 24/94
See application file for complete search history.

(56) References Cited

U.S. PATENT DOCUMENTS 4,380,862 A    4/1983  Nyul
2001/0048536 A1*  12/2001  Lehmann ........... H04N 1/02815
                                          358/513
(Continued)

FOREIGN PATENT DOCUMENTS

DE    3009985 A1    9/1981
DE    102011011862 A1    8/2012
DE    102012212095 A1    6/2013

OTHER PUBLICATIONS

Hamamatsu, "Stealth Dicing Technology and Applications", Hamamatsu Photonics K.K.., Electron Tube Division, Mar. 2005, Technical Information, TLAS9004E01.

*Primary Examiner* — Mohsen Ahmadi
*Assistant Examiner* — Gustavo Ramallo
(74) *Attorney, Agent, or Firm* — McDermott Will & Emery LLP (57) ABSTRACT

A method for producing a multiplicity of semiconductor chips (13) is provided, comprising the following steps: —providing a wafer (1) comprising a multiplicity of semiconductor bodies (2), wherein separating lines (9) are arranged between the semiconductor bodies (2), —depositing a contact layer (10) on the wafer (1), wherein the material of the contact layer (10) is chosen from the following group: platinum, rhodium, palladium, gold, and the
(Continued)

contact layer (10) has a thickness of between 8 nanometers and 250 nanometers, inclusive, —applying the wafer (1) to a film (11), —at least partially severing the wafer (1) in the vertical direction along the separating lines (9) or introducing fracture nuclei (12) into the wafer (1) along the separating lines (9), and —breaking the wafer (1) along the separating lines (9) or expanding the film (11) such that a spatial separation of the semiconductor chips (13) takes place, wherein the contact layer (10) is also separated. A semiconductor chip, a component and a method for producing the latter are also provided.

18 Claims, 10 Drawing Sheets

(51) Int. Cl.
   *H01L 33/00*     (2010.01)
   *H01L 31/0224*   (2006.01)
   *H01L 23/00*         (2006.01)

(52) U.S. Cl.
   CPC ...... *H01L 24/94* (2013.01); *H01L 31/022441* (2013.01); *H01L 33/0091* (2013.01); *H01L 24/03* (2013.01); *H01L 24/32* (2013.01); *H01L 24/83* (2013.01); *H01L 2221/68327* (2013.01); *H01L 2221/68336* (2013.01); *H01L 2224/03002* (2013.01); *H01L 2224/05669* (2013.01); *H01L 2224/293* (2013.01); *H01L 2224/2929* (2013.01); *H01L 2224/29291* (2013.01); *H01L 2224/29339* (2013.01); *H01L 2224/32225* (2013.01); *H01L 2224/8384* (2013.01); *H01L 2224/83469* (2013.01); *H01L 2224/83801* (2013.01); *H01L 2224/83851* (2013.01); *H01L 2224/94* (2013.01); *H01L 2924/15156* (2013.01)

(56) References Cited

U.S. PATENT DOCUMENTS

| | | | |
|---|---|---|---|
| 2007/0176181 A1* | 8/2007 | Kusunoki | ............ B28D 5/0011 |
| | | | 257/79 |
| 2012/0322238 A1 | 12/2012 | Lei et al. | |
| 2013/0140592 A1 | 6/2013 | Lee et al. | |
| 2014/0004635 A1 | 1/2014 | Takahashi et al. | |
| 2015/0348921 A1* | 12/2015 | Ganitzer | ................ H01L 24/03 |
| | | | 438/462 |

* cited by examiner

SEMICONDUCTOR CHIP, METHOD FOR PRODUCING A PLURALITY OF SEMICONDUCTOR CHIPS AND METHOD FOR PRODUCING AN ELECTRONIC OR OPTOELECTRONIC DEVICE AND ELECTRONIC OR OPTOELECTRONIC DEVICE

A semiconductor chip, a method for producing a plurality of semiconductor chips, a method for producing an electronic or optoelectronic device and such a device are provided.

Document US 2012/322238 A1 provides a method for producing a plurality of semiconductor chips.

One object is to provide a simplified method for producing a plurality of semiconductor chips. In particular, the method is intended to enable simplified singulation of the semiconductor chips.

Furthermore, it is intended to provide a semiconductor chip which may be produced using a simplified method. It is moreover intended to provide a method for mounting such semiconductor chips in which an optoelectronic or electronic semiconductor device is produced.

These objects are achieved by a method having the steps of claim 1, by a semiconductor chip having the features of claim 7, by a method for producing an electronic or optoelectronic device having the steps of claim 14 and by a device having the features of claim 15.

Advantageous further developments and embodiments of the two methods and of the semiconductor chip are each indicated in the dependent claims.

To produce a plurality of semiconductor chips, a wafer is provided with a plurality of semiconductor bodies on a film. The film is preferably expandable. Dicing lines along which the finished semiconductor chips are to be singulated are in this case arranged between the semiconductor bodies. The dicing lines are here preferably initially merely imaginary lines, along which the subsequent semiconductor chips are to be separated from one another.

A contact layer is deposited on the wafer in a next step. Deposition of the contact layer may proceed for example by means of sputtering or vapor deposition. The contact layer is particularly preferably applied over the entire surface of the wafer.

The contact layer preferably comprises one of the following materials or consists of one of the following materials: platinum, rhodium, palladium, gold.

Gold may here only be recommended on a limited basis as a material for the contact layer, since its suitability for mounting by means of soldering is limited. Particularly preferably, the contact layer therefore comprises platinum, rhodium or palladium or consists of one of these materials.

The contact layer preferably has a thickness of between 8 nanometers and 250 nanometers inclusive.

It is particularly preferable for the contact layer to be no thicker than 100 nanometers, no thicker than 64 nanometers, no thicker than 32 nanometers or no thicker than 20 nanometers.

Particularly preferably, the contact layer is no thinner than 8 nanometers, no thinner than 20 nanometers or no thinner than 32 nanometers.

In a further step, the wafer is at least partially, i.e. completely or partially, cut through vertically, i.e. starting from a first major face of the wafer towards a second major face of the wafer along the dicing lines. Cutting through the wafer results in dicing trenches along the dicing lines. The dicing trenches preferably extend as far as the contact layer, i.e. the wafer is completely cut through and is held together solely by the contact layer. The dicing trenches may be produced for example by plasma etching or scribing. Scribing is preferably performed with a laser (laser scribing process). A mechanical scribing process is however also conceivable, in which however only a small amount of material is removed in the vertical direction. It is furthermore also possible firstly to perform a scribing process, for example with a laser, and then a plasma etching process.

The dicing lines do not necessarily have to extend perpendicular to one another in a chessboard pattern. It is for example also possible for the dicing lines to form a honeycomb pattern. In this way, semiconductor chips with a hexagonal base area may be produced. Dicing lines which do not run perpendicular to one another but rather extend for example in the form of a honeycomb pattern are possible in particular when using plasma etching to cut through the wafer.

The dicing trenches preferably have a comparatively small width. According to one embodiment, the ratio of the width of the dicing trench to the thickness of the wafer is no greater than 1:2. For example, the width of the dicing trench is no greater than 60 micrometers in the case of a wafer thickness of around 120 micrometers. The ratio of the width of the dicing trench to the thickness of the wafer is preferably no greater than 1:3 or 1:4. Particularly preferably, the ratio of the width of the dicing trench to the thickness of the wafer is no greater than 1:5. In the case of a wafer thickness of around 120 micrometers, the dicing trench is thus particularly preferably no wider than 24 micrometers.

As an alternative to producing dicing trenches, seed cracks may also be introduced into the wafer along the dicing lines. The introduction of seed cracks inside the wafer may proceed for example by means of stealth dicing.

Plasma etching means plasma-enhanced dry etching methods in which material is removed from a workpiece both by a chemical reaction and a physical mechanism. In a plasma etching method, the proportion of material removed by the chemical reaction, the "chemical component", and the material removed by the physical mechanism, the "physical component", may be adapted as required. It is moreover also possible for a plasma etching process to be composed of a plurality of sub-processes, which in turn have different proportions of the chemical and physical components.

The chemical component of a plasma etching process leads to isotropic material removal, which is generally material-selective, while the physical component leads to directed material removal.

Plasma etching methods for example include plasma-enhanced reactive ion etching (ME for short). In this process, material is removed substantially physically with a small chemical component.

Prior to plasma etching for the purpose of cutting through along the dicing lines, a patterned photoresist layer is preferably applied to the wafer which covers the surfaces of the subsequent semiconductor chips and only leaves the dicing lines free.

Scribing along the dicing lines may in the present case proceed mechanically, i.e. with a cutting device. On scribing, the wafer is either partially cut through, i.e. a certain amount of material is removed along the dicing lines in the vertical direction, or at least seed cracks are introduced into the wafer along the dicing lines. Furthermore, scribing may also proceed with a laser, wherein likewise either material is removed or seed cracks are induced inside the wafer. The amount of material removed in a laser scribing method is generally markedly greater than in the case of mechanical scribing, in which only a small amount of material is removed.

In stealth dicing seed cracks are generated within the wafer by means of a focused laser. In contrast to a laser scribing method, in which material is removed from a front face towards a back face of the wafer by the laser, in stealth dicing the laser merely induces seed cracks in the material of the wafer.

After partially cutting through the wafer or the induction of seed cracks inside the wafer, the wafer can be broken along the dicing lines, such that spatial separation of the semiconductor chips takes place, wherein the contact layer is also diced. Alternatively, the film onto which the wafer has been applied, may be expanded such that spatial separation of the semiconductor chips likewise proceeds, wherein the contact layer is also diced.

In plasma etching the wafer is cut right through particularly preferably along the dicing lines in the vertical direction starting from the first major face of the wafer as far as the contact layer. In other words, in plasma etching the entire semiconductor body is particularly preferably cut through in the vertical direction, such that the semiconductor bodies are held together merely by the contact layer, which has preferably been applied over the entire surface. Final spatial separation of the semiconductor chips then proceeds particularly preferably by expansion of the film.

Particularly preferably, the surface of the wafer to which the contact layer is applied is cleaned, for example wet chemically, prior to deposition. If the surface onto which the contact layer is applied consists of silicon or the surface comprises silicon, the natural oxide layer is particularly preferably removed from the surface prior to deposition of the contact layer. The oxide layer may in this case be removed prior to introduction of the wafer into the installation for depositing the contact layer (ex situ) or directly in the installation for depositing the contact layer (in situ).

According to one embodiment of the method, a further contact layer is applied to a surface of the semiconductor bodies remote from the contact layer and the further contact layer is diced along the dicing lines by a dicing method, wherein the seed cracks arise inside the wafer along the dicing lines. The further contact layer is provided for front contacting of the subsequent semiconductor chips. This embodiment has the advantage that seed cracks are produced in the wafer at the same time as dicing of the front contacts and no further method step is needed for this purpose.

The present method has the advantage that no additional separate dicing process has to be used to cut through the contact layer. Due to the small thickness of the metallic contact layer, the weak mechanical loads applied to the contact layer during breaking or expansion of the film are sufficient to completely dice the contact layer along the dicing lines. Even if residues of the contact layer remain on the semiconductor chip which project laterally beyond flanks of the semiconductor chip, these are not generally much of a hindrance for subsequent mounting due to the small thickness of the contact layer.

Furthermore, the residues are generally comparatively small, since the present method only produces very narrow dicing trenches and the residues are no greater than a dicing trench.

According to one embodiment of the method, during dicing of the semiconductor chips it is possible to dispense completely with the use of a laser. A semiconductor chip during the dicing of which the use of a laser has been wholly dispensed with generally comprises side faces which are free of entrained metal. Preferably, the side faces of the semiconductor chip do not in this case comprise any more than 1 at % of a metallic element.

Particularly preferably, provision is made for the contact layer not to be diced by means of a laser, for example by means of a laser scribing method. A semiconductor chip whose contact layer was not diced with a laser comprises side faces, the halves of which that adjoin the contact layer are free of entrained metal. The half of the side face of the semiconductor chip adjoining the contact layer in this case preferably comprises no more than 1 at % of a metallic element.

Particularly preferably, each semiconductor body comprises a semiconductor surface which is formed by a semiconductor material. The contact layer is preferably deposited in direct contact onto this semiconductor surface. It should be noted at this point that the surface of the wafer is generally formed at least in part by the surface of the semiconductor bodies.

Particularly preferably, the contact layer alone forms an electrical contact of the semiconductor chip. This means in particular that the contact layer is not part of a layer stack which consists predominantly or completely of metallic layers and contributes to electrical contacting. In other words, the contact layer is applied in direct contact onto the semiconductor body and moreover comprises a major face which is remote from the semiconductor body and is freely accessible in the finished semiconductor chip.

The semiconductor body and/or the semiconductor surface preferably comprises one of the following materials or is formed of one of the following materials: silicon, germanium.

A semiconductor chip which may be produced using the present method in particular comprises a semiconductor body to which a contact layer is applied, wherein the material of the contact layer is selected from the following group: platinum, rhodium, palladium, gold. Furthermore, the contact layer preferably has a thickness of between 8 nanometers and 250 nanometers inclusive.

Particularly preferably, a contact layer forms an ohmic contact with the semiconductor surface. In particular, the above-stated materials, platinum, rhodium, palladium and gold, are suitable for forming an ohmic contact with a semiconductor surface which comprises silicon or germanium or consists of silicon or germanium. The contact layer may be annealed to increase process reliability. For example, the contact layer may be annealed at around 200° C. for about an hour in a nitrogen atmosphere. It is alternatively also possible to anneal the contact layer at around 300° C. for about five minutes in an argon atmosphere. With comparatively thin wafers it is generally desired to have to use as few process steps as possible during production of the semiconductor chips, so as to reduce the likelihood of wafer breakage. With a thin platinum layer as contact layer, in particular good ohmic contact may be achieved both on silicon and on a germanium surface. It is then advantageously possible to dispense with annealing of the contact layer.

According to one embodiment of the semiconductor chip, the contact layer is applied to a major face of the semiconductor body over the entire surface thereof.

Particularly preferably, the semiconductor chip has an edge length which is no greater than 5 millimeters. The edge length is particularly preferably no greater than 2 millimeters, no greater than 1.5 millimeters, no greater than 1.2 millimeters or no greater than 1.0 millimeters. Small semiconductor chips in particular, for which scribing and breaking and also plasma etching are preferred dicing methods due to the small space requirement, may be fabricated with the described method advantageously with a small space requirement. In the method, as large a proportion as possible of the wafer surface is in particular advantageously utilized.

Furthermore, the method offers the advantage of being able to dispense with complex patterning of the contact layer prior to dicing by means of photolithography.

Particularly preferably, the semiconductor chip comprises a semiconductor body which comprises an epitaxial layer sequence with an active zone which generates electromagnetic radiation when in operation. The epitaxial layer sequence is preferably mechanically stabilized by a carrier. Furthermore, a mirror layer is preferably arranged between the epitaxial semiconductor layer sequence and the carrier, which directs radiation from the active zone to a radiation exit face of the semiconductor chip. The mirror layer may, for example, comprise a Bragg mirror. Furthermore, it is also possible for the mirror layer to comprise one or more metallic individual layers or to consist of one or more metallic individual layers.

According to one embodiment, the epitaxial semiconductor layer sequence is applied to the carrier by means of a joining material, for example a solder. In other words, a joining layer, such as a solder layer, is preferably located between the mirror layer and the carrier. The solder layer is preferably formed of a metal or a metal alloy. The contact layer is here particularly preferably applied to a major face of the carrier opposite the radiation exit face.

The carrier is particularly preferably formed of silicon or germanium or comprises silicon or germanium. According to one embodiment, the silicon or the germanium is doped, such that the specific electrical resistance is preferably no greater than 100 mΩ*cm, preferably no greater than 50 mΩ*cm and particularly preferably no greater than 25 mΩ*cm.

Such an optoelectronic semiconductor chip, which is suitable for emitting electromagnetic radiation and in which the epitaxial semiconductor layer sequence is stabilized by a carrier, wherein a mirror is arranged between the carrier and the epitaxial semiconductor layer sequence, is also known as a thin-film semiconductor chip. In particular, the carrier of the thin-film semiconductor chip is different from a growth substrate on which the epitaxial semiconductor layer sequence has been epitaxially grown.

According to one embodiment of the method, on cutting through of the wafer the mirror layer is likewise cut through, particularly preferably completely. If a solder layer is located between the mirror layer and the carrier, the solder layer is preferably also cut through on cutting through of the wafer, likewise particularly preferably completely. Particularly preferably, on cutting through the wafer first of all a laser scribing process is used, in order to cut through the epitaxial semiconductor layer sequence together with the mirror layer and optionally the solder layer. The carrier is then preferably cut through by means of a plasma etching process at least partially and preferably right through to the contact layer. This embodiment of the method offers the advantage of being able to cut through the metallic layers between the epitaxial semiconductor layer sequence and the carrier, such as a metallic mirror layer and/or a metallic joining layer, by means of the laser scribing process. Using a plasma etching process to cut through the metallic layers is possible only with very great difficulty.

A semiconductor chip described here may for example be mounted on a chip carrier or in a device package by means of one of the following methods: soldering, adhesive bonding with an electrically conductive adhesive, silver sintering. In this case, an electrically conductive joint arises between the contact layer and the chip carrier or between the contact layer and the device package. Particularly preferably, ohmic contact arises.

The contact layer of the semiconductor chip preferably comprises a substantially homogeneous material composition over its entire thickness. The contact layer for example comprises a metallic layer with a substantially homogeneous material composition. When mounting the semiconductor chip on a chip carrier or in a device package, a multilayer zone may arise from this substantially pure metallic contact layer. In this case, the metal of the contact layer may for example diffuse into the adjacent material of the semiconductor chip, such as the material of the semiconductor surface.

If the contact layer is formed for example of platinum and applied in direct contact onto a semiconductor surface which comprises germanium or silicon, a sublayer of platinum germanide or platinum silicide, which generally displays very good adhesion, may form from a substantially pure contact layer of platinum. If a tin-containing solder is used to mount the semiconductor chip, platinum stannides may form on the side of the contact layer facing the joining material. If a silver-containing joining material is used, for instance a solder or a silver paste for silver sintering, thin, laterally contiguous mixed crystal layers of platinum and silver form on the side facing the joining material. The same applies mutatis mutandis to a contact layer which is formed of palladium or rhodium or comprises one of these materials.

When a conductive adhesive filled with silver particles is used as joining material, local mixed crystals may form, for example.

The formation of stannides in the joining process for mounting the semiconductor chip leads on the one hand to a good adhesive bond and on the other hand prevents complete consumption of the contact layer. In this way, mechanically stable and furthermore electrically and thermally highly conductive coupling of the semiconductor chip to the chip carrier or the device package is achieved.

A platinum-containing contact layer is in particular advantageously protected from oxidation. For this reason, an adhesive filled with silver particles also couples particularly well electrically to a platinum-containing contact layer. Micrometer- or nanometer-scale silver particles, as used in silver sintering pastes, may couple particularly well to a platinum-containing contact layer due to the noble nature thereof.

If a gold-containing contact layer is used, all that predominantly takes place on the semiconductor side is interdiffusion between the contact layer and the semiconductor material of the semiconductor body. The use of gold for the contact layer is therefore recommended only to a limited degree. When using tin-containing solders to mount semiconductor chips, gold stannides may form in conjunction with a gold-containing contact layer.

Further advantageous embodiments and further developments of the invention are revealed by the exemplary embodiments described below in connection with the figures.

A method for producing a plurality of semiconductor chips according to one exemplary embodiment is described with reference to the schematic sectional representations of FIGS. 1 to 6.

The schematic sectional representation according to FIG. 7 shows an optoelectronic device according to one exemplary embodiment.

A method according to a further exemplary embodiment is explained in greater detail with reference to the schematic sectional representations of FIGS. 8 to 10.

The schematic sectional representation according to FIG. 11 shows an optoelectronic device according to one exemplary embodiment.

A method according to a further exemplary embodiment is explained in greater detail with reference to the schematic sectional representations of FIGS. 12 to 15.

A further exemplary embodiment of a method for producing a plurality of semiconductor chips is described with reference to the schematic sectional representations of FIGS. 17 to 19.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

Figure 1:
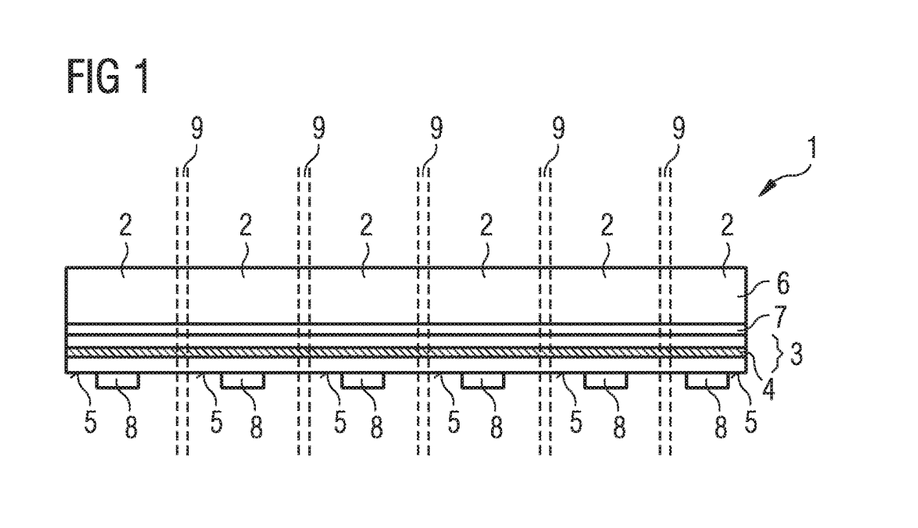

In the method according to the exemplary embodiment of FIGS. 1 to 6, a wafer 1 is provided (FIG. 1). The wafer 1 comprises a plurality of semiconductor bodies 2 with an epitaxial layer sequence 3 comprising an active zone 4 which generates electromagnetic radiation when in operation. The electromagnetic radiation is emitted from a radiation exit face 5 of the subsequent semiconductor chips. Particularly preferably, the active zone 4 generates blue light when in operation. Between the semiconductor bodies 2 dicing lines 9 are arranged, along which the semiconductor chips are to be subsequently singulated.

The epitaxial layer sequence 3 is based on a nitride compound semiconductor material. Nitride compound semiconductor materials are compound semiconductor materials which contain nitrogen, such as the materials of the system $In_xAl_yGa_{1-x-y}N$ with $0 \le x \le 1$, $0 \le y \le 1$ and $x+y \le 1$.

The epitaxial semiconductor layer sequence 3 is mechanically stabilized by a carrier 6. The carrier 6 is formed of silicon. Between the carrier 6 and the epitaxial semiconductor layer sequence 3 a mirror layer 7 is arranged which, when the subsequent semiconductor chips are in operation, directs radiation generated in the active zone 4 to the radiation exit face 5. The mirror layer is for example metallic.

A further metallic contact layer 8 is applied to a radiation exit face 5 of the subsequent semiconductor chips, said further metallic contact layer 8 serves contacting of the subsequent semiconductor chips from a front side. The further metallic layer 8 has already been removed in the regions of the dicing lines 9, for example by a laser scribing process or photolithographically.

Figure 2:
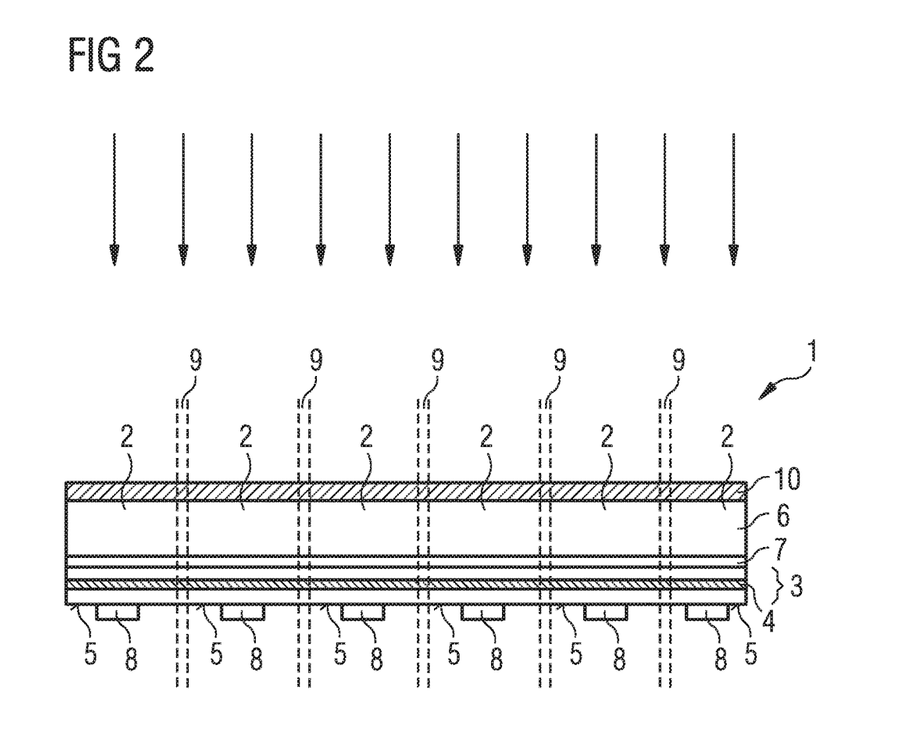

In the present case, the carrier 6 comprises silicon. First of all, the natural silicon dioxide layer, which has formed on the semiconductor surface of the carrier 6, is removed, for example by an atomization process (not shown). A contact layer 10, comprising platinum or consisting of platinum, is then deposited by means of sputtering on the semiconductor surface of the carrier 6 (FIG. 2). In the present case, the platinum layer 10 has a thickness of around 48 nanometers.

Figure 3:
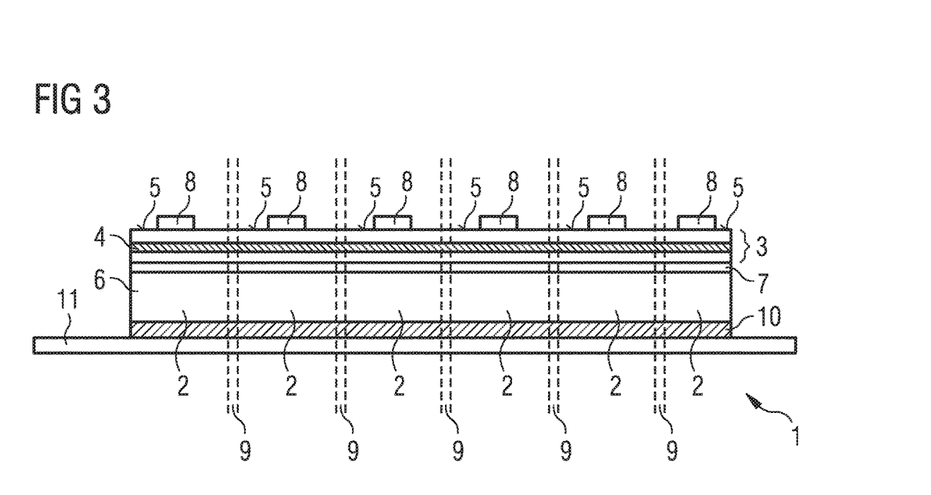

In a next step the wafer 1 with the contact layer 10 is applied onto an expandable film 11, wherein the contact layer 10 faces the film 11 (FIG. 3).

Figure 4:
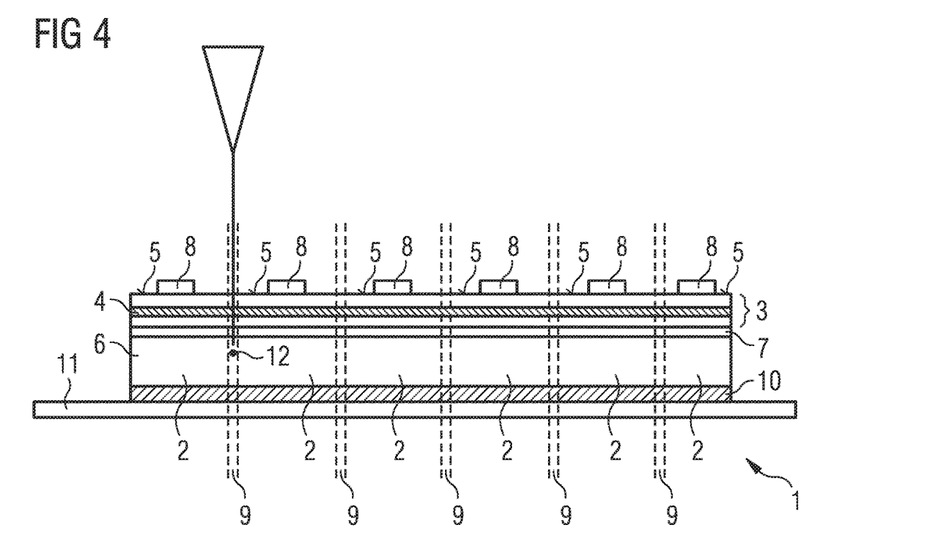

A stealth dicing process is then used to generate seed cracks 12 inside the wafer 1, in the present case inside the silicon carrier 6, along the dicing lines 9 (FIG. 4). It is moreover also possible for seed cracks 12 already to have been generated inside the wafer 1 during the laser scribing process for cutting through the front contact layers 8.

Figure 5:
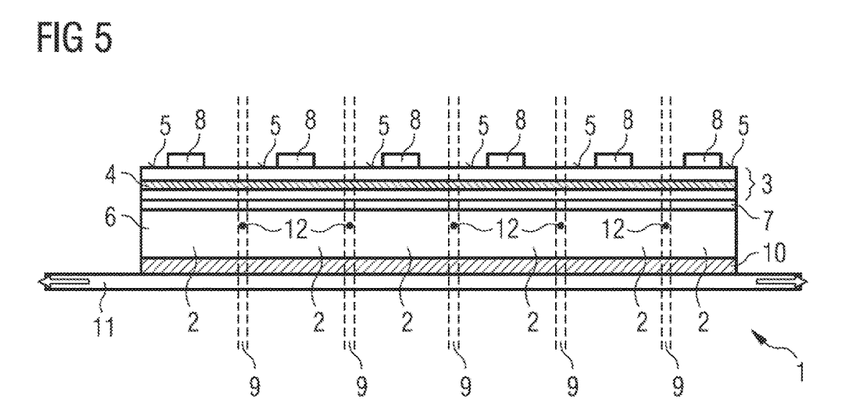
Figure 6:
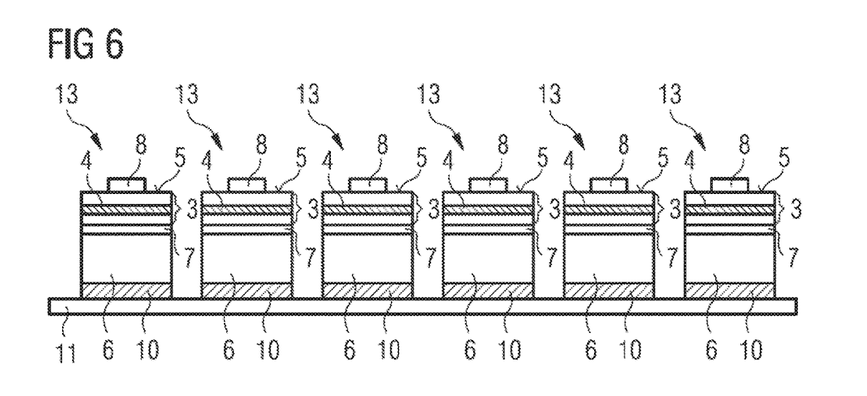

The film is then expanded laterally, as indicated by the arrows in FIG. 5. This results in spatial separation of the semiconductor chips 13 from one another and in particular the contact layer 10 is cut right through, such that the semiconductor chips 13 are then separately present on the expanded film 11, as shown in FIG. 6. The semiconductor chips 13 have an edge length of around 350 micrometers. The semiconductor chips 13 preferably comprise a base area of around 350 micrometers by around 350 micrometers.

Figure 7:
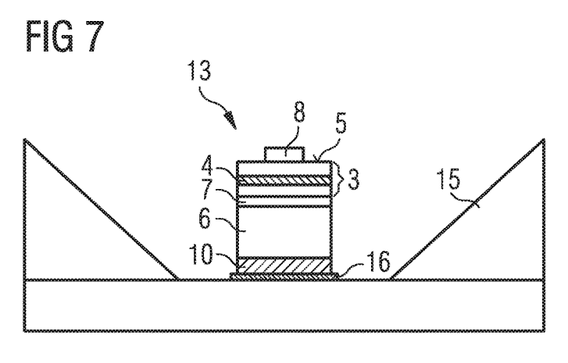

To produce the optoelectronic device according to the exemplary embodiment of FIG. 7, a semiconductor chip 13 according to FIG. 6 is mounted in a recess 14 of a device package 15. Mounting proceeds in the present case by way of a joining layer 16, which consists of a silicon adhesive filled with silver particles and produces an electrically conductive joint between the semiconductor chip 13 and the device package 15.

Figure 8:
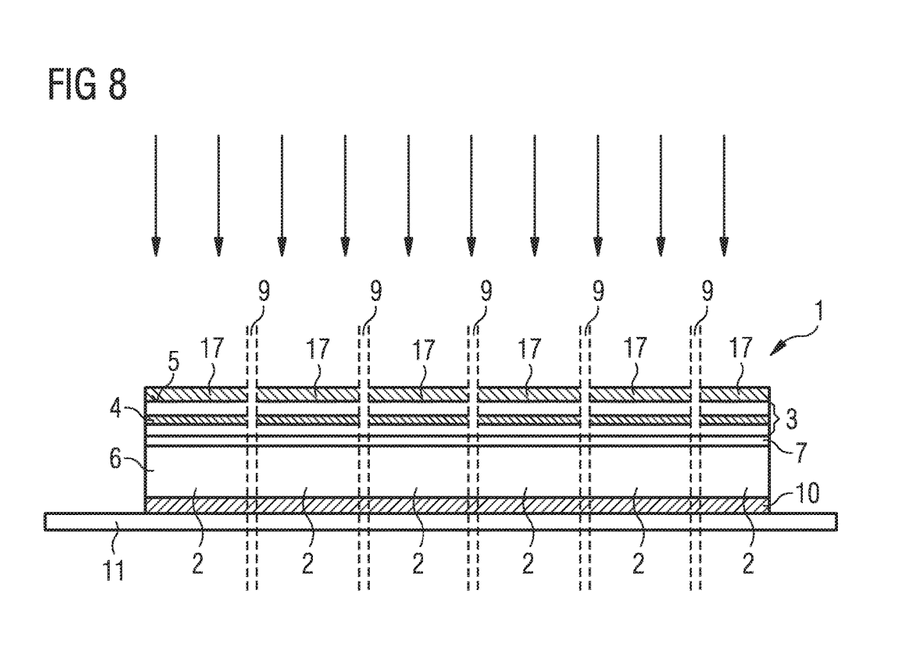
Figure 9:
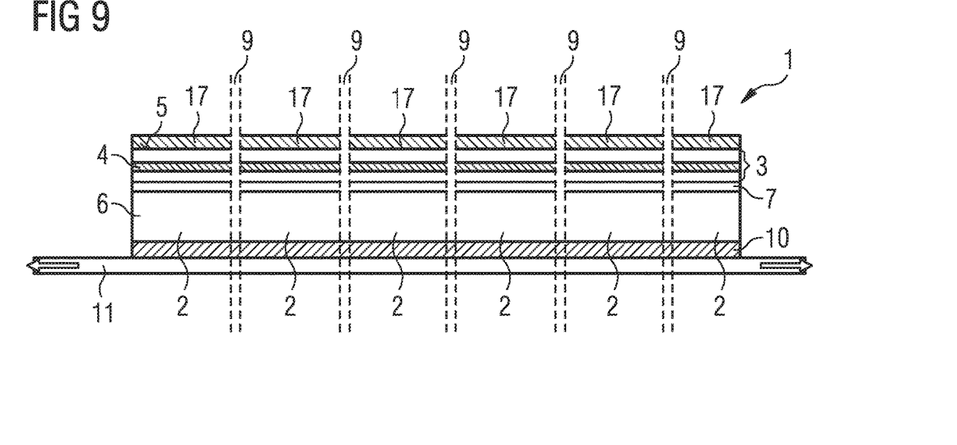
Figure 10:
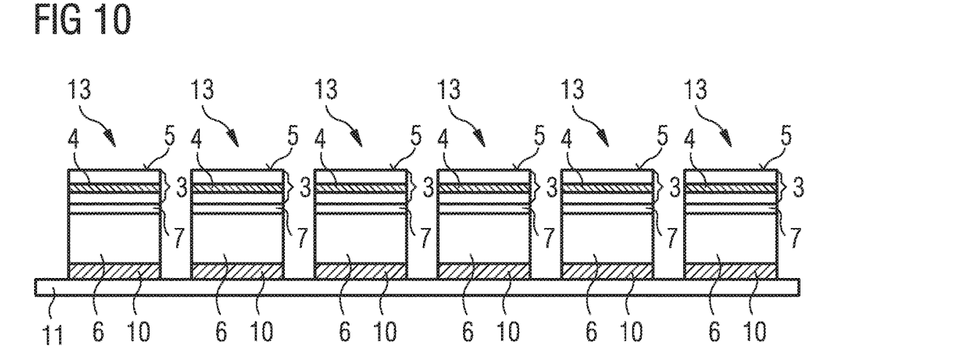

In the exemplary embodiment according to FIGS. 8 to 10, a wafer 1 is provided which comprises a plurality of semiconductor bodies 2. The semiconductor bodies 2 comprise a carrier 6 which is formed of germanium. Furthermore, the semiconductor body 2 comprises an epitaxial semiconductor layer sequence 3, which is suitable for emitting infrared radiation from a radiation exit face 5 when in operation. Such an epitaxial semiconductor layer sequence 3 is preferably formed of an arsenide compound semiconductor material. Arsenide compound semiconductor materials are compound semiconductor materials which contain arsenic, such as the materials of the system $In_xAl_yGa_{1-x-y}As$ with $0 \le x \le 1$, $0 \le y \le 1$ and $x+y \le 1$.

Between the epitaxial semiconductor layer sequence 3 and the germanium carrier 6 a mirror layer 7 is again arranged, which is suitable for directing radiation from the active zone 4 in the direction of the radiation exit face 5 of the finished semiconductor chip.

After wet chemical pre-cleaning with an aqueous ammonia solution, a contact layer 10 around 27 nanometers thick consisting of platinum or comprising platinum (not shown) is applied to the semiconductor surface of the carrier 6 by vapor deposition.

In a next step, the wafer 1 is applied onto an expandable film 11. Then, as shown in FIG. 8, the wafer 1 is diced along its dicing lines 9 by means of plasma etching vertically as far as the contact layer 10, i.e. from a first major face of the wafer towards a second major face of the wafer. Prior to the plasma etching, a photoresist layer 17 is applied to the first major face of the wafer 1 which protects the subsequent radiation exit faces 5 of the finished semiconductor chips 13 from plasma attack.

The dicing trenches then arising in the wafer 1 have a width of around 9 micrometers. After the plasma etching process, the contact layer 10 remains in the dicing trenches.

In a next step the film 11 is expanded, as the arrows in FIG. 9 are intended to symbolize. In this case, the contact layer 10 within the dicing trenches formed by the plasma etching tears at any desired point, such that spatially separate semiconductor chips 13 arise (FIG. 10).

In the exemplary embodiment according to FIGS. 8 to 10, the finished semiconductor chips 13 have a base area of around 200 micrometers by 200 micrometers.

Figure 11:
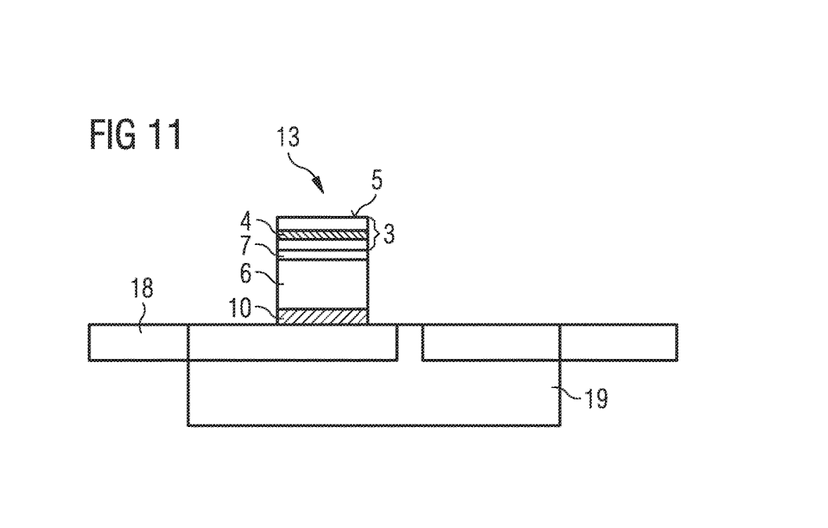

To produce the optoelectronic device according to the exemplary embodiment of FIG. 11, one of the finished semiconductor chips 13 according to FIG. 10 is adhesively bonded, using an epoxy adhesive filled with silver particles, into conductive track strips 18 around which a plastics material 19 is injection molded (FIG. 11).

Figure 12:
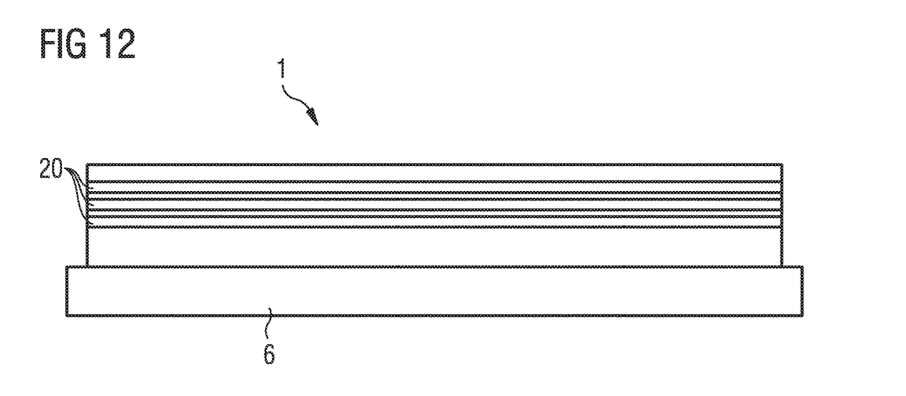

In the method according to the exemplary embodiment of FIGS. 12 to 15, a wafer 1 is provided with semiconductor bodies 2 which each comprise three solar cells 20 arranged one above the other. The solar cells 20 are deposited in inverted metamorphic manner and transferred to a silicon carrier 6 (FIG. 12).

Figure 13:
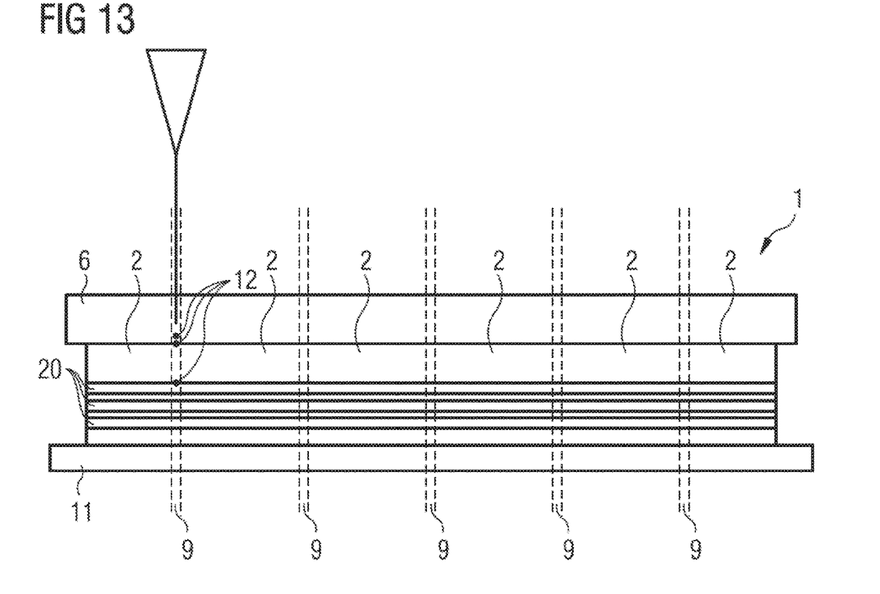

The wafer 1 is applied in such a way to an expandable film 11 that the silicon carrier 6 is remote from the film 11. In a next step, seed cracks 12 are introduced inside the wafer 1 along dicing lines 9 by means of a stealth dicing process (FIG. 13).

Figure 14:
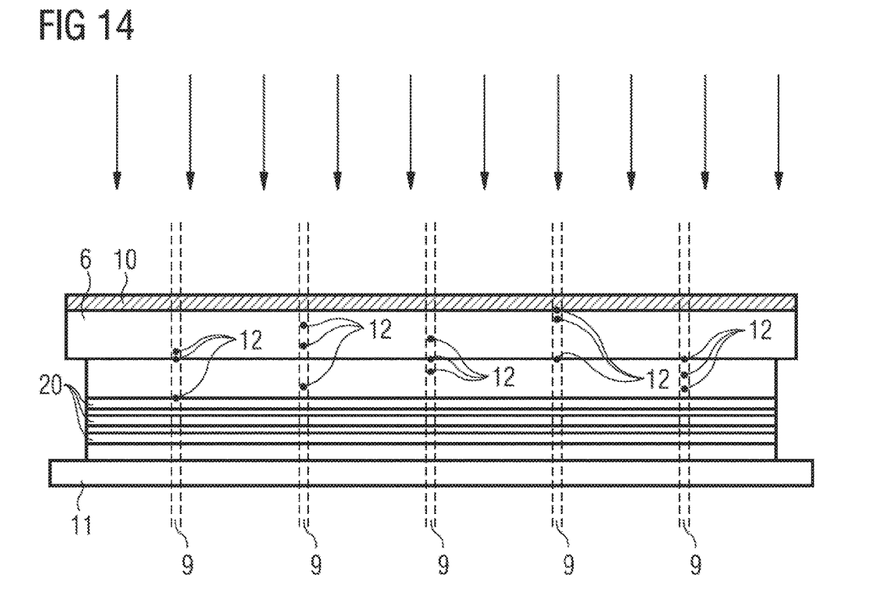

The exposed major face of the silicon carrier 6 is then provided over its entire surface with a contact layer 10 formed of platinum and having a thickness of around 17 nanometers (FIG. 14). In this exemplary embodiment therefore, in contrast to the exemplary embodiments already described, the seed cracks 12 are firstly generated within the wafer 1 and then the contact layer 10 is deposited.

Figure 15:
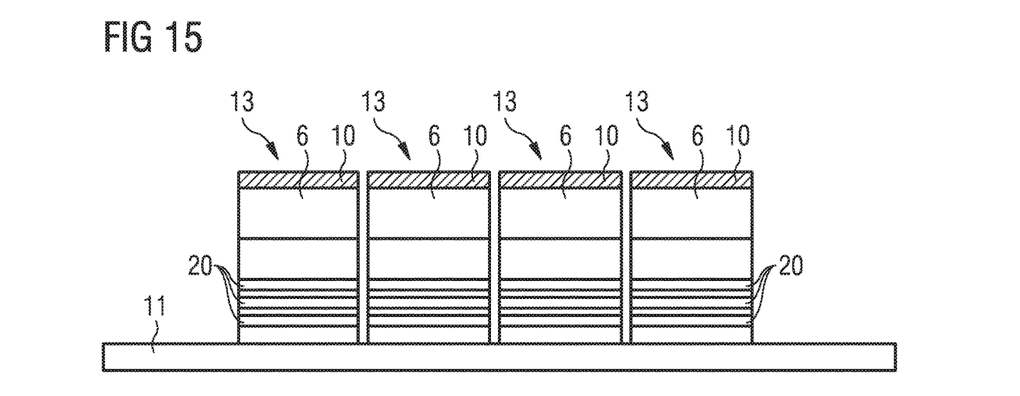

In a next step, the semiconductor chips 13 are separated from one another spatially by breaking (FIG. 15). The finished semiconductor chips 13 have a base area of around 3 millimeters×3 millimeters.

Figure 16:
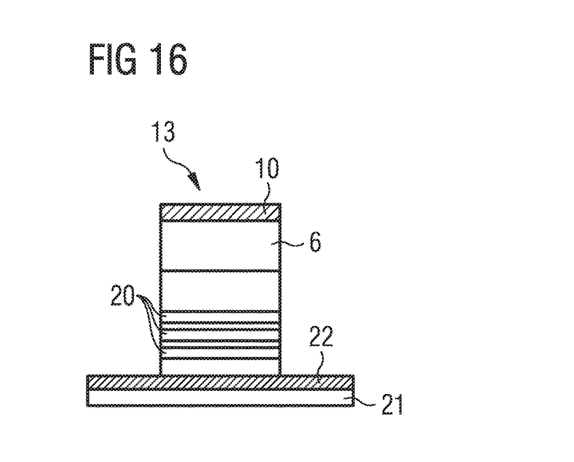
FIG. 16 is a schematic sectional representation of an optoelectronic device according to a further exemplary embodiment.

The optoelectronic device according to the exemplary embodiment of FIG. 16 comprises an optoelectronic semiconductor chip 13 as produced with the method according to the exemplary embodiment of FIGS. 12 to 15. The semiconductor chip 13 is mounted by silver sintering on a chip carrier 21 comprising a silver layer 22.

Figure 17:
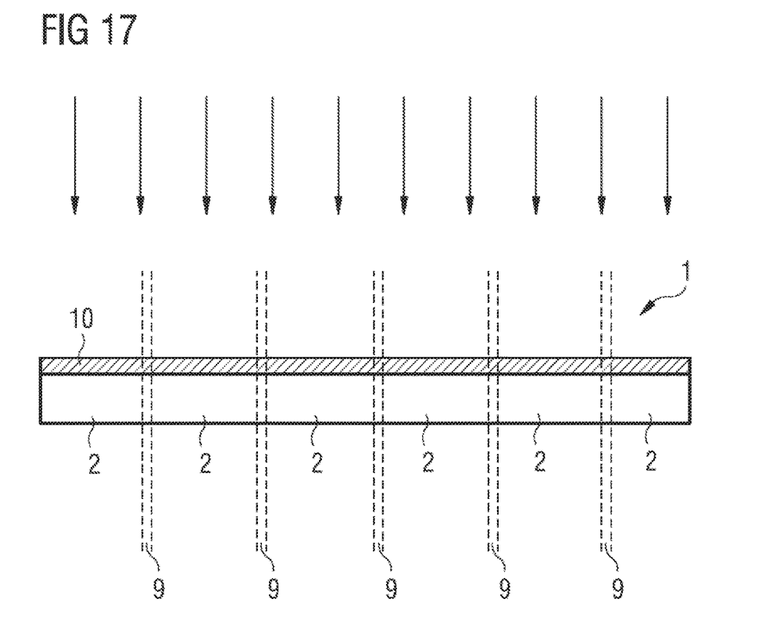
Figure 18:
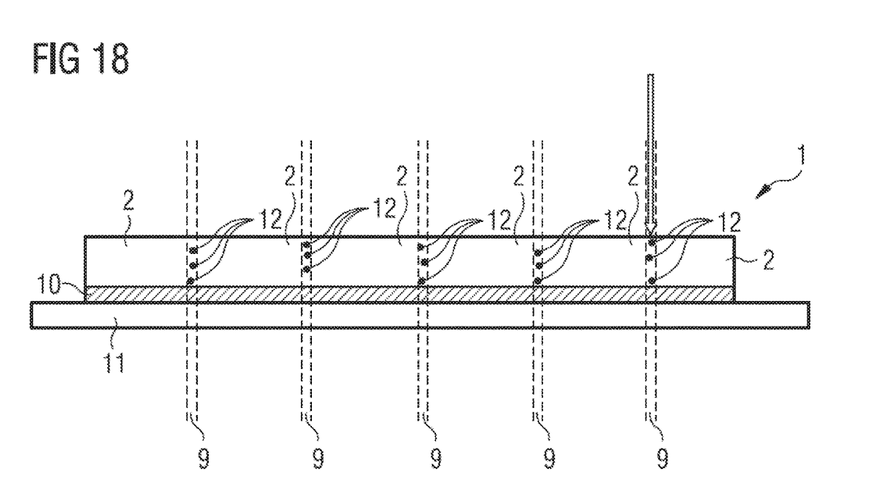
Figure 19:
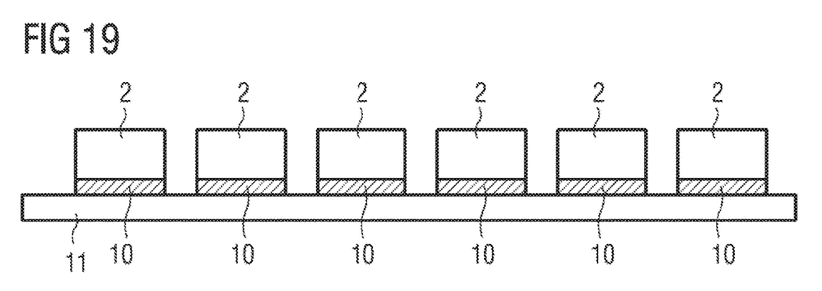

In the method according to the exemplary embodiment of FIGS. 17 to 19, a wafer 1 is provided with electronic semiconductor bodies 2 which comprise silicon or consist of silicon. A contact layer 10 which has a thickness of around 65 nanometers and is formed of platinum is deposited on the wafer 1 by means of sputtering (FIG. 17). The contact layer 10 is suitable for grounding and cooling the finished electronic semiconductor chip 13. Alternatively, a contact layer 10 of platinum with a thickness of around 38 nanometers is also suitable for this purpose. If the contact layer 10 is intended to be suitable for electrically contacting the semiconductor chip 13, a platinum layer 10 with a thickness of around 15 nanometers is for example suitable for this purpose.

The wafer 1 is applied onto a film 11 and seed cracks 12 are induced within the semiconductor wafer 1 along the dicing lines 9 by means of mechanical scribing (FIG. 18). The film 11 is then expanded, such that spatial separation of the semiconductor chips 13 takes place, wherein the contact layer is also diced (FIG. 19). The finished electronic semiconductor chips 13 have a base area of 1 millimeter×1 millimeter.

Figure 20:
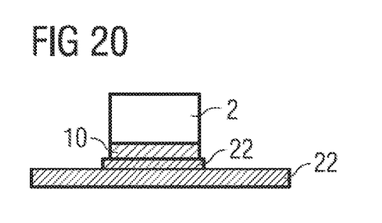
FIG. 20 is a further sectional representation of an electronic device according to a further exemplary embodiment.

The electronic semiconductor chips 13 produced using the methods according to FIGS. 17 to 19 may for example be soldered onto a chip carrier 21 with a joining layer 16 of a lead-free solder alloy of tin, silver and copper ("SAC solder") (FIG. 20). Furthermore, a silver-filled epoxy resin is also suitable as joining material for bonding the semiconductor chip 13 to the chip carrier 21. The electronic semiconductor chip 13 could likewise be firmly sintered with a mixture of predominantly nanoscale silver particles to a mating contact surface of platinum which has been applied to the chip carrier 21.

Figure 21:
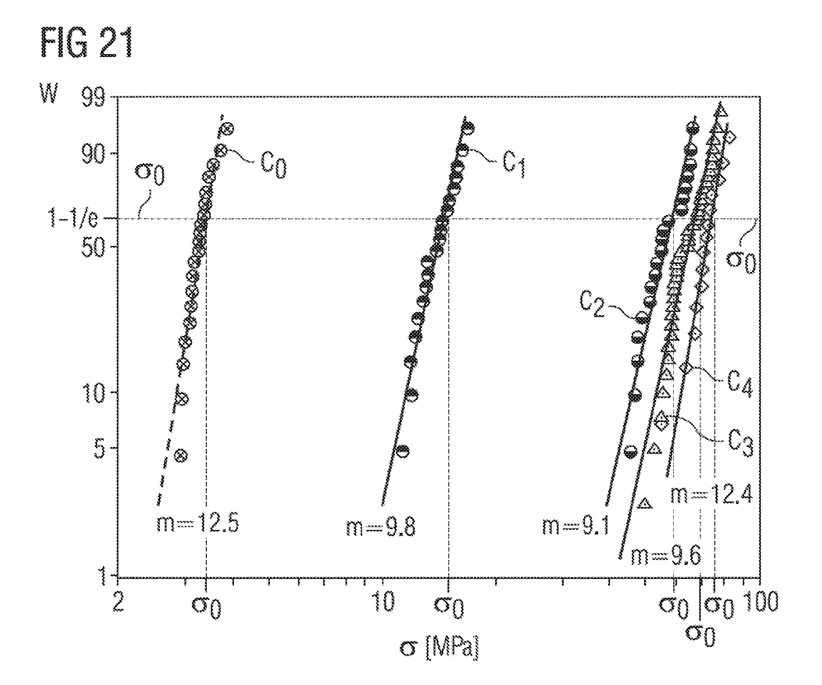
FIG. 21 shows Weibull percentiles for various joining layers with which a semiconductor chip is applied to a chip carrier or a device package.

FIG. 21 shows Weibull percentiles W (y axis) for various joints as a function of shear strength σ (x axis). Curve $C_0$ here indicates the Weibull percentiles for a joining layer 16 which is formed of a silver paste from a first manufacturer and bonds a silicon semiconductor body 2 to a semiconductor surface of silicon. In this case, no contact surface 10 of platinum is arranged between the semiconductor chip 13 and the semiconductor surface.

The dashed line through the values of the curve $C_0$ is an adjustment of the function $P=1-\exp\{-\sigma/\sigma_0)^m\}$ to the curve $C_0$. The value m may be determined from the adjustment, this value being m=12.5 for the curve $C_0$. From the point of intersection of the horizontal lines 1−1/e plotted parallel to the x axis and the adjusted curve, it is furthermore possible to determine the shear strength $\sigma_0$ of the joint. The values m and $\sigma_0$ together characterize the quality of the joint. The smaller is $\sigma_0$, the lower is the shear strength of the respective joint. Furthermore, the smaller is the value m, the greater is the probability of failure of the joint under loads which are low compared with the characteristic load $\sigma_0$. A small value m is thus an indicator of a higher risk of premature failure of the joint.

Curves $C_1$, $C_2$, $C_3$ and $C_4$ are Weibull percentiles for joints in which a silicon semiconductor body 2 with a 40 nanometer thick contact layer 10 of platinum has been applied to a semiconductor surface of silicon. The only difference in the curves $C_1$, $C_2$, $C_3$ and $C_4$ are the joining materials.

In the case of curve $C_1$ the joint between the semiconductor chip 13 and the semiconductor surface is produced by silver sintering using a silver paste from a second manufacturer. The straight line through the curve $C_1$ in turn represents an adjustment of the function $P=1-\exp\{(-\sigma/\sigma_0)^m\}$. The resultant value m is m=9.8.

Finally, curve $C_2$ represents the Weibull percentiles for a joining layer 16 obtained by silver sintering with a silver paste from the first manufacturer. The adjusted function $P=1-\exp\{(-\sigma/\sigma_0)^m\}$ (dashed line) results in m=9.1.

Curve $C_3$ represents the Weibull percentiles for a joining layer 16 of a silver-filled conductive adhesive. The adjusted function $P=1-\exp\{(-\sigma/\sigma_0)^m\}$ (dashed line) results in m=9.6.

Curve $C_4$ is the Weibull percentiles for a joining layer 16 of an SAC solder. The adjusted function $P=1-\exp\{(-\sigma/\sigma_0)^m\}$ (dashed line) results in m=12.4.

It may be inferred from FIG. 21 that all the joints where the semiconductor chip 13 comprises a contact layer 10 of platinum have a higher shear strength $\sigma_0$ than a joint of a semiconductor chip 13 which has been applied to a silicon semiconductor surface without a contact layer of platinum. A soldered joint furthermore has the highest shear strength (see curve $C_4$).

Furthermore, it may be inferred from the values m of the various curves that the failure probability of all the joints is quite low.

The present application claims priority from German patent application 10 2014 117 591.3, which is hereby included by reference.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing a plurality of semiconductor chips having the following steps:
   providing a wafer with a plurality of semiconductor bodies, wherein dicing lines are arranged between the semiconductor bodies;
   depositing a contact layer on the wafer, wherein the material of the contact layer is selected from the following group: platinum, rhodium, palladium, and gold, and
   wherein the contact layer has a thickness of between 8 nanometers and 250 nanometers inclusive;
   applying the wafer onto a film;
   at least partially cutting through the wafer in the vertical direction along the dicing lines, in which dicing trenches arise, wherein the ratio of the width of the dicing trenches to a thickness of the wafer is in each case no greater than 1:3; and
   expanding the film, such that spatial separation of the semiconductor chips takes place, wherein the contact layer is also diced.

2. The method according to claim 1, wherein the wafer is partially cut through by means of plasma etching or scribing or the seed cracks are introduced by means of stealth dicing or scribing.

3. The method according to claim 1, wherein the contact layer is applied over the entire surface of the wafer.

4. The method according to claim 1, wherein each semiconductor body comprises a semiconductor surface which is formed by a semiconductor material, and
   wherein the contact layer is deposited in direct contact on the semiconductor surface.

5. The method according to claim 1, wherein the semiconductor body and/or the semiconductor surface comprises one of the following materials: silicon, germanium.

6. The method according to claim 1, wherein each semiconductor body comprises:
   an epitaxial semiconductor layer sequence with an active zone which generates electromagnetic radiation when in operation,
   a carrier, which mechanically stabilizes the epitaxial semiconductor layer sequence, and
   a metallic mirror layer between the epitaxial semiconductor layer sequence and the carrier which directs radiation from the active zone to a radiation exit face of the semiconductor chip,
   wherein the wafer is only partially cut through in the vertical direction using a laser scribing process,
   wherein the metallic mirror layer is likewise cut through on cutting through of the wafer, and
   wherein the wafer is cut through completely in the vertical direction as far as the contact layer using a laser scribing process.

7. A semiconductor chip produced using the method of claim 1, the semiconductor chip having a semiconductor body onto which the contact layer has been applied, wherein the material of the contact layer is selected from the following group: platinum, rhodium, palladium, gold, and
   wherein the contact layer has a thickness of between 8 nanometers and 250 nanometers inclusive.

8. The semiconductor chip according claim 7 comprising a semiconductor surface to which the contact layer has been applied in direct contact.

9. The semiconductor chip according to claim 7, wherein the contact layer forms an ohmic contact with the semiconductor surface.

10. The semiconductor chip according to claim 7, wherein the contact layer is applied over the entire surface of a major face of the semiconductor body.

11. The semiconductor chip according to claim 7, having an edge length which is no greater than 5 millimeters.

12. The semiconductor chip according to claim 7, the semiconductor body comprising:
    an epitaxial semiconductor layer sequence with an active zone which generates electromagnetic radiation when in operation;
    a carrier, which mechanically stabilizes the epitaxial semiconductor layer sequence; and
    a mirror layer between the epitaxial semiconductor layer sequence and the carrier which directs radiation from the active zone to a radiation exit face of the semiconductor chip, wherein the contact layer is applied to a major face of the carrier opposite the radiation exit face.

13. The semiconductor chip according to claim 7, wherein the contact layer alone forms an electrical contact of the semiconductor chip.

14. The semiconductor chip according to claim 7, wherein the semiconductor surface and/or the carrier are formed of silicon or germanium.

15. A method for producing an electronic or optoelectronic device, wherein a semiconductor chip according to claim 7 is mounted on a chip carrier or in a device package by means of one of the following methods: soldering, adhesive bonding using an electrically conductive adhesive, or silver sintering, and
    wherein an electrically conductive joint arises between the contact layer and the chip carrier or the device package.

16. A device produced using a method according to claim 15.

17. A method for producing a plurality of semiconductor chips having the following steps:
    providing a wafer with a plurality of semiconductor bodies, wherein dicing lines are arranged between the semiconductor bodies;
    depositing a contact layer on the wafer, wherein the material of the contact layer is selected from the following group: platinum, rhodium, palladium, and gold,
    wherein the contact layer has a thickness of between 8 nanometers and 250 nanometers inclusive;
    applying the wafer onto a film;
    at least partially cutting through the wafer in the vertical direction along the dicing lines or introducing seed cracks into the wafer along the dicing lines; and
    expanding the film, such that spatial separation of the semiconductor chips takes place, wherein the contact layer is also diced,
    wherein each semiconductor body comprises:
       an epitaxial semiconductor layer sequence with an active zone which generates electromagnetic radiation when in operation,
       a carrier, which mechanically stabilizes the epitaxial semiconductor layer sequence,
       a metallic mirror layer between the epitaxial semiconductor layer sequence and the carrier which directs radiation from the active zone to a radiation exit face of the semiconductor chip,
    wherein the wafer is only partially cut through in the vertical direction using a laser scribing process,
    wherein the metallic mirror layer is likewise cut through on cutting through of the wafer, and wherein the wafer is cut through completely in the vertical direction as far as the contact layer using a laser scribing process.

18. A semiconductor chip produced with a method having the following steps:
- providing a wafer with a plurality of semiconductor bodies, wherein dicing lines are arranged between the semiconductor bodies;
- depositing a contact layer on the wafer;
- applying the wafer onto a film;
- at least partially cutting through the wafer in the vertical direction along the dicing lines or introducing seed cracks into the wafer along the dicing lines; and
- expanding the film, such that spatial separation of the semiconductor chips takes place, wherein the contact layer is also diced, wherein the material of the contact layer is selected from the following group: platinum, rhodium, palladium, and gold,
wherein the contact layer has a thickness of between 8 nanometers and 250 nanometers inclusive, and
wherein the semiconductor body comprises:
- an epitaxial semiconductor layer sequence with an active zone which generates electromagnetic radiation when in operation;
- a carrier, which mechanically stabilizes the epitaxial semiconductor layer sequence; and
- a mirror layer between the epitaxial semiconductor layer sequence and the carrier which directs radiation from the active zone to a radiation exit face of the semiconductor chip, wherein the contact layer is applied to a major face of the carrier opposite the radiation exit face.

* * * * *